(12) United States Patent
Caldwell et al.

(10) Patent No.: US 9,996,000 B2
(45) Date of Patent: Jun. 12, 2018

(54) TEST PATTERN LAYOUT FOR TEST PHOTOMASK AND METHOD FOR EVALUATING CRITICAL DIMENSION CHANGES

(71) Applicants: International Business Machines Corporation, Armonk, NY (US); Toppan Printing Co., Ltd., Tokyo (JP)

(72) Inventors: Brian N. Caldwell, Meridian, ID (US); Yuki Fujita, Tokyo (JP); Raymond W. Jeffer, South Burlington, VT (US); James P. Levin, South Burlington, VT (US); Joseph L. Malenfant, Jr., Colchester, VT (US); Steven C. Nash, Essex Junction, VT (US)

(73) Assignees: International Business Machines Corporation, Armonk, NY (US); Toppan Printing Co., Ltd., Tokyo (JP)

( * ) Notice: Subject to any disclaimer, the term of this patent is extended or adjusted under 35 U.S.C. 154(b) by 0 days. days.

(21) Appl. No.: 15/094,226

(22) Filed: Apr. 8, 2016

(65) Prior Publication Data

US 2016/0223902 A1 Aug. 4, 2016

Related U.S. Application Data

(63) Continuation of application No. 14/162,894, filed on Jan. 24, 2014, now Pat. No. 9,372,394.

(51) Int. Cl.
*H01L 23/58* (2006.01)
*G03F 1/50* (2012.01)
(Continued)

(52) U.S. Cl.
CPC .................. *G03F 1/50* (2013.01); *G03F 1/44* (2013.01); *G03F 1/70* (2013.01); *G03F 1/78* (2013.01); *G06F 17/5081* (2013.01)

(58) Field of Classification Search
CPC ......................................... G03F 1/44
(Continued)

(56) References Cited

U.S. PATENT DOCUMENTS 4,411,972 A 10/1983 Narken et al.
6,136,478 A 10/2000 Usui et al.
(Continued)

OTHER PUBLICATIONS

Arora. Notice of Allowance and Fees Due for U.S. Appl. No. 14/162,894; dated Mar. 28, 2016; 7 pages.
(Continued)

*Primary Examiner* — Ajay K Arora
(74) *Attorney, Agent, or Firm* — Steven J. Meyers; Hoffman Warnick LLC (57) ABSTRACT

Aspects of the present invention relate to a test photomask and a method for evaluating critical dimension changes in the test photomask. Various embodiments include a test photomask. The test photomask includes a plurality of cells having a varied density pattern. The plurality of cells include a first group of cells arranged along a first line, the first group of cells having a first combined density ratio. The plurality of cells also include a second group of cells arranged along a second line, the second group of cells having a second combined density ratio. In the plurality of cells, the second combined density ratio for the second group of cells is equal to the first combined density ratio of the first group of cells. The varied density pattern is configured to substantially neutralize fogging effects.

17 Claims, 6 Drawing Sheets

(51) Int. Cl.
*G03F 1/78* (2012.01)
*G03F 1/70* (2012.01)
*G06F 17/50* (2006.01)
*G03F 1/44* (2012.01)

(58) Field of Classification Search
USPC .......................................................... 257/48
See application file for complete search history.

(56) References Cited

U.S. PATENT DOCUMENTS

| | | |
|---|---|---|
| 7,266,800 B2 | 9/2007 | Sezginer |
| 7,560,198 B2 | 7/2009 | Jang et al. |
| 7,691,542 B2 | 4/2010 | Fukuhara |
| 2003/0203315 A1 | 10/2003 | Farahi et al. |
| 2004/0180268 A1 | 9/2004 | Kawashima et al. |
| 2005/0287451 A1 | 12/2005 | Hudek et al. |
| 2007/0114453 A1 | 5/2007 | Emi et al. |
| 2009/0181551 A1 | 7/2009 | Tan et al. |
| 2010/0082313 A1 | 4/2010 | Tejnil |
| 2010/0162195 A1 | 6/2010 | Kim |
| 2011/0033788 A1 | 2/2011 | Kato |

OTHER PUBLICATIONS

Sundberg et al. "Two Complementary methods to Characterize long range proximity effects due to develop loading", Journal: Proceedings of the SPIE—The International Society for Optical Engineering, vol. 7823, 10 pages; publisher: The International Society of Engineering, Presented at the Photomask Technology 2010 Conference held 13-16, Sep. 10 at Monterey, CA, USA.
Lee et al. "Reduction of Local CD-Linewidth Variations in Resist Develop through Acoustic Streaming", SPIE vol. 7488-18 (2009), Society of Photo-Optical Instrumentation Engineers.
Arora. Office Action Communication for U.S. Appl. No. 14/162,894, dated Jul. 22, 2015, 21 pages.
Arora. Office Action Communication for U.S. Appl. No. 14/162,894, dated Dec. 18, 2015, 7 pages.
Arora. Notice of Allowance and Fees Due for U.S. Appl. No. 14/162,894, dated Mar. 28, 2016, 7 Pages.
Arora. Office Action Communication for U.S. Appl. No. 15/094,220, dated Oct. 21, 2016, 20 pages.
Final Office Action for U.S. Appl. No. 15/094,220, dated May 15, 2017, 14 pages.
Notice of Allowance for U.S. Appl. No. 15/094,220, dated Feb. 2, 2018, 12 pages.

TEST PATTERN LAYOUT FOR TEST PHOTOMASK AND METHOD FOR EVALUATING CRITICAL DIMENSION CHANGES

BACKGROUND

1. Technical Field

The disclosure is related generally to designing test pattern layouts to isolate an effect of interest when competing effects exist. More particularly, the disclosure is related to the design of a test pattern layout for a test photomask, a test photomask and a method for evaluating and isolating critical dimension changes in the test photomask.

2. Related Art

A semiconductor chip is built on a wafer using many layers of material and many imaging steps to form the semiconductor devices. The material layers are often patterned with a specific layout or design that is first created on a photomask before being transferred to the semiconductor wafer. The photomask contains the desired pattern to be printed on a semiconductor wafer for a given layer of the design. It is critical that all errors on the photomask be minimized to enable full functionality of the semiconductor devices. The pattern is created in the photomask translating the designer's intent into clear and opaque regions in an absorbing layer of the photomask. The photomask patterning process is achieved, for example, by applying a photoresist and using an electron beam to expose some regions. A subsequent develop of the resist creates a soft mask for an etch to transfer the resist pattern into the absorber layer. The resist is then stripped and the pattern quality verified on the photomask.

When using pattern generators to write or print patterns on the photomask, it is desirable to have good uniformity of the features of interest. The metric and terminology commonly applied to these features on photomasks is critical dimension (CD) uniformity. Good CD uniformity may substantially ensure that features in the photomask will result in the pattern being transferred accurately when deployed as part of the wafer photolithography step. Effective transfer is important because the photomask design is replicated thousands of times on wafers for the purpose of building semiconductor structures.

During the photomask patterning process, a variety of errors can occur, which may inhibit CD uniformity. Two common errors that occur when using an electron beam pattern generator to write patterns in semiconductors are fogging effects and develop loading effects. These errors and the degree/effect of the errors may depend upon a number of factors, including: electron beam condition, the configuration of the pattern on the photomask, the materials of the photomask, the composition of the photoresist exposed to the electron beam to create a removable mask of the pattern, the "developer" solvent used to remove exposed portions of the semiconductor structure, etc.

To compensate for these errors in photomask patterning, photomask manufacturers often create test photomasks and run test patterning processes to determine how the CD uniformity will be affected by errors. After running and analyzing the test photomask process, a final photomask may be created that may compensate for the anticipated errors that will occur when writing or printing the pattern on the final semiconductor structure. Additionally, to compensate for the detected errors during the test photomask process, manufacturers may adjust or modify pattern generator conditions used in writing or printing the pattern by: adjusting the exposure strength, adjusting the exposure beam conditions, etc.

The use of a test photomask and/or adjustments to the final photomask may not completely eliminate CD non-uniformity within the semiconductor structure if the individual contributors to each error cannot be identified and separated. That is, although the test photolithography process may determine the error effects on CD uniformity on the photomask, it may not be determined how much of an effect fogging has on the CD uniformity, compared to the effects of develop loading effects. As such, the final photomasks are created to compensate for overall effects with the aspirations of substantially minimizing errors and/or maintaining CD uniformity during the photomask patterning process on all features. However, without knowing the exact effect of each error (e.g., fogging, develop loading, etch loading) on the photomask patterns, CD uniformity cannot be appropriately corrected.

BRIEF SUMMARY

A test photomask and a method for isolating contributors to critical dimension errors in photomasks are disclosed. Various embodiments include a test pattern layout and a test photomask including the layout. The test photomask may include: a plurality of cells having a varied density pattern, the plurality of cells including: a first group of cells arranged along a first line, the first group of cells having a first combined density ratio; and a second group of cells arranged along a second line, the second group of cells having a second combined density ratio. The second combined density ratio for the second group of cells is equal to the first combined density ratio of the first group of cells.

A first aspect of the invention includes a test pattern layout for a test photomask, the test pattern layout comprising: a plurality of cells having a varied density pattern, the plurality of cells including: a first group of cells arranged along a first line, the first group of cells having a first combined density ratio; and a second group of cells arranged along a second line, the second group of cells having a second combined density ratio, wherein the second combined density ratio for the second group of cells is equal to the first combined density ratio of the first group of cells.

A second aspect of the invention includes a test photomask comprising: a varied density pattern configured spatially to substantially neutralize fogging effects within a photomask.

A third aspect of the invention includes a method for evaluating critical dimensions in a test photomask, the method comprising: fabricating a test photomask using an electron beam to write a test pattern layout configured to substantially neutralize a fogging effect, the test pattern layout including a plurality of cells having a varied density pattern, wherein the plurality of cells includes: a first group of cells arranged along a first line, the first group of cells having a first combined density ratio; and a second group of cells arranged along a second line, the second group of cells having a second combined density ratio, wherein the second combined density ratio for the second group of cells is equal to the first combined density ratio of the first group of cells; and evaluating a critical dimension of the test pattern layout on the test photomask to identify an error attributed to an effect other than the fogging effect.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As described herein, aspects of the invention relate to a test pattern layout for a test photomask, a test photomask and a method for evaluating critical dimension changes in the test photomask. Specifically, as described herein, aspect of the invention are related to a test photomask including a plurality of cells having a varied density pattern.

Figure 1:
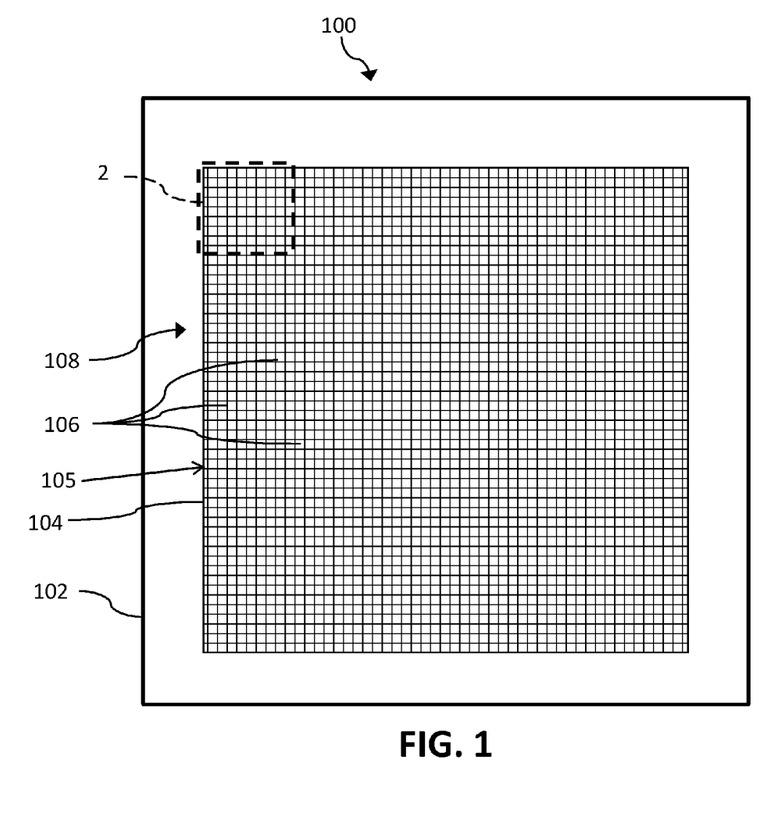
FIG. 1 shows a plane view of a test photomask including a plurality of cells having a varied density pattern, according to various embodiments of the invention.

Turning to FIG. 1, a plane view of a test photomask including a plurality of cells having a varied density pattern according to various embodiments is shown. More specifically, as shown in FIG. 1, a test photomask 100 includes a transparent substrate layer 102 and a pattern layer 104 on transparent layer 102. Substrate layer 102 of test photomask 100 may include any material having desirable properties, including, but not limited to: glass, quartz, or silicon dioxide. That is, substrate layer 102 may include any substantially rigid material that supports the pattern and has appropriate optical properties for the application.

Figure 2:
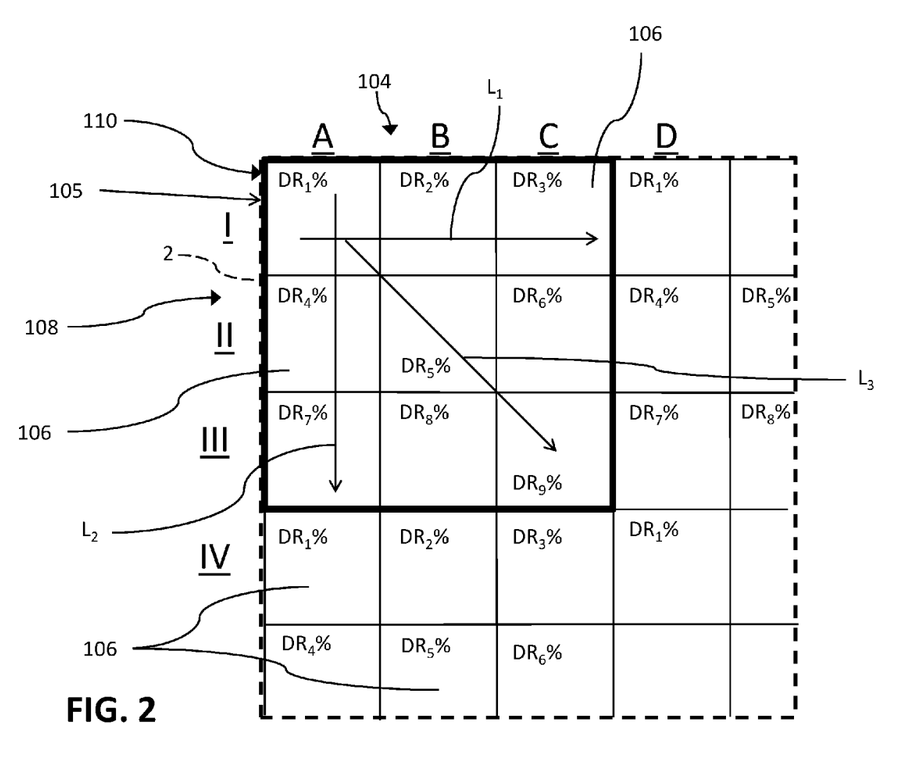
FIGS. 2-4 each show enlarged plane views of a portion of a test photomask in FIG. 1 including a plurality of cells having a varied density pattern, according to embodiments of the invention.
Figure 3:
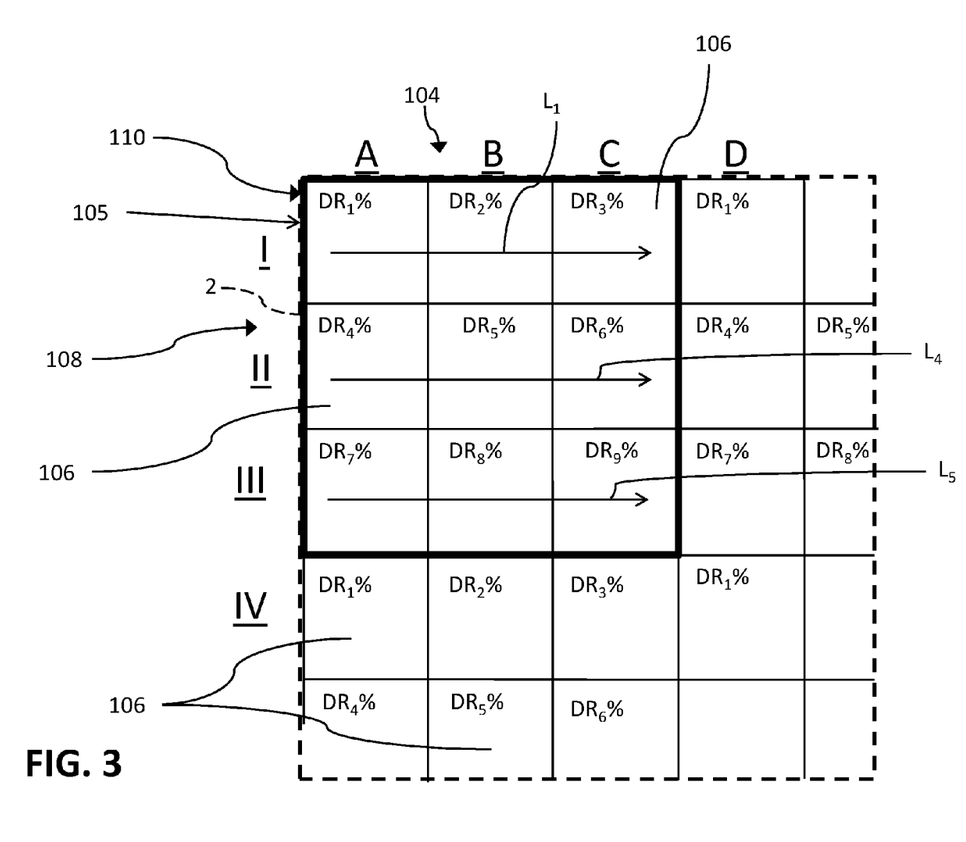
Figure 4:
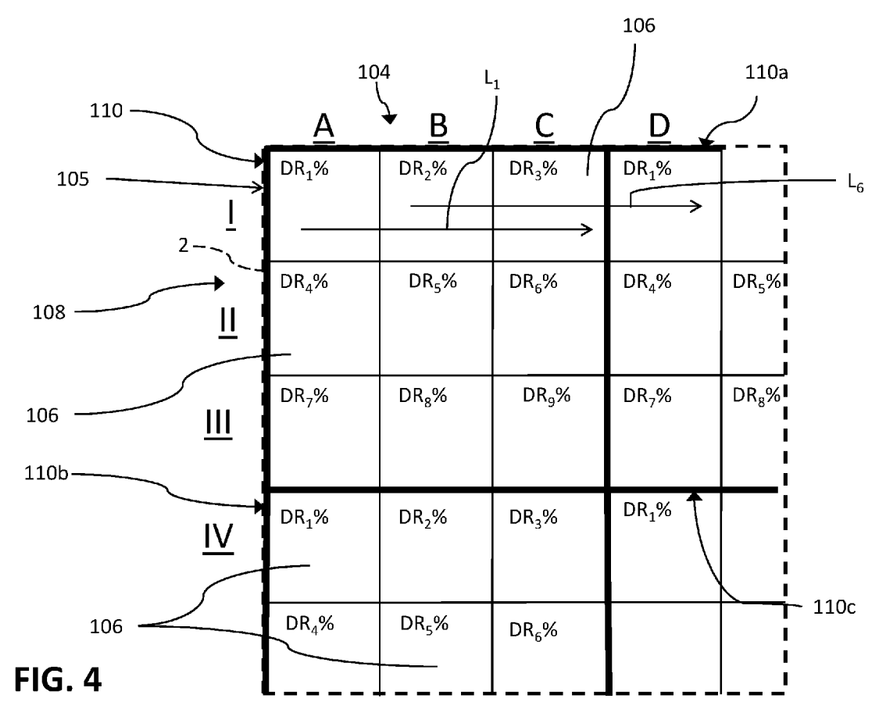

Test photomask 100, as shown in FIG. 1, may include a test pattern layout 105, i.e., in pattern layer 104, including a plurality of cells 106 having a varied density pattern 108. That is, test pattern layout 105 may include the plurality of cells 106 which form varied density pattern 108 throughout the entire pattern layer 104, such that test photomask 100 does not include a uniform density throughout pattern layer 104. As discussed herein, each of the plurality of cells 106 of test pattern layout 105 may include a density ratio $DR_n$% (FIGS. 2-4). Density ratio $DR_n$% for each of the plurality of cells 106 forming varied density pattern 108 may be related to the degree of transparency of each cell 106. That is, density ratio $DR_n$% for each of the plurality of cells 106 may correspond to a test pattern formed in each cell, where the test pattern of each cell 106 includes a ratio of density. For example, where a cell 106 includes density ratio $DR_n$% of 90%, the test pattern may be substantially minimal or small, such that cell 106 may have a substantially dense pattern filling the majority of cell 106. Conversely, where a cell 106 includes density ratio $DR_n$% of 10%, cell 106 may include a sparse pattern.

As shown in FIG. 1, pattern layer 104 of test photomask may include any material that may allow varied density pattern 108 to be formed within pattern layer 104. More specifically, pattern layer 104 may be made out of any optically appropriate material, e.g., chrome, which may include the plurality of cells 106 having varied density ratios $DR_n$%. As understood in the art, various other layers may also be provided, e.g., an anti-reflective coating, etc. As discussed herein, the plurality of cells 106 forming varied density pattern 108 of test pattern layout 105 may be configured to substantially neutralize effects on one length scale, for example, electron beam fogging effects created by backscattered electrons during the mask patterning process. "Substantially neutralize" indicates sufficient elimination of the fogging effect such that any errors in test pattern layout 105 can be attributed to another effect. In this fashion, a critical dimension of the test pattern layout on the test photomask can be evaluated to identify an error attributed to an effect other than the fogging effect. The other effect can take a variety of forms. One particular effect, however, includes a develop loading effect. Other effects may include, but are not limited to, signatures resulting from: resist apply, resist bake, etch loading, etc.

Turning to FIGS. 2-4, an enlarged plane view of a portion of test photomask 100 in FIG. 1 is shown including the plurality of cells 106 having varied density pattern 108, according to various embodiments of the invention. For ease of reference, the portion of test pattern layout 105 of test photomask 100 shown has been provided with column lettering (e.g., A-D) and row numbering (e.g., I-IV). As such, each of the plurality of cells 106 may be identified by a single column letter (e.g., A-D) and a single row number (e.g., I-IV). For example, a first cell A-I of the plurality of cells 106 may be located at the top left corner of test pattern layout 105 in test photomask 100.

As shown in FIGS. 2-4, varied density pattern 108 formed by the plurality of cells 106 of test pattern layout 105 may be substantially repetitive in pattern layer 104. More specifically, a cell group 110 of a predetermined number of the plurality of cells 106, each having distinct density ratios $DR_n$%, may be substantially repeated to form varied density pattern 108 in pattern layer 104 of test photomask 100. For example, as shown in FIGS. 2-4, cell group 110 may consist of a three (3) by three (3) group of cells of the plurality of cells 106, where each of the plurality of cells 106 in cell group 110 include distinct density ratios $DR_{1-9}$%. More specifically, as shown in FIGS. 2-4, density ratio $DR_1$% of first cell A-I may be distinct from the density ratios $DR_n$% (e.g., $DR_2$%, $DR_4$%, $DR_5$%) of each adjacent cell to first cell A-I (e.g., cells A-II, B-I, B-II) of the plurality of cells 106 included in cell group 110. Additionally, density ratio $DR_1$% of first cell A-I may be distinct from the density ratios $DR_n$% (e.g., $DR_3$%, $DR_{6-9}$%) of each additional cell (e.g., cells A-III, B-III, C-I-III) of the plurality of cells 106 included in cell group 110.

Additionally, as shown in FIGS. 2-4, and discussed herein, each of the plurality of cells 106 may include density ratio $DR_n$% equal to a distinct cell positioned a predetermined number of cells away from the cell. The predetermined number of cells separating two distinct cells of the plurality of cells 106 having equal density ratio $DR_n$% may be dependent upon the dimension of cell group 110. More specifically, the number of cells included in cell group 110 may determine the predetermined number of cells that separates two distinct cells of the plurality of cells 106 that may include equal density ratios $DR_n$%. The separation between the two distinct cells of the plurality of cells 106 may be separated the predetermined number of cells in a straight line. More specifically, the two distinct cells having equal density ratios $DR_n$% may be separated the predetermined number of cells along a straight line within the same column (e.g., A-D), the same row (e.g., I-IV), or in a straight diagonal line (e.g., A-I to D-IV).

For example, as shown in FIGS. 2-4, cell group 110 may include a three (3) by three (3) groups of cells of the plurality of cells 106. As a result, the predetermined number of cells positioned away from two distinct cells 106 having equal density ratios $DR_n\%$ may be three (3). More specifically, as shown in FIGS. 2-4, cell A-I and cell D-I may be positioned three cells apart, and may include equal density ratios $DR_1\%$. That is, using cell A-I as a reference point, cell D-I is positioned three cells away from cell A-I in row I, and as a result of cell group 110 being a three (3) by three (3) group of cells, density ratios $DR_1\%$ of cell A-I may be equal to density ratios $DR_1\%$ of cell D-I. Additionally, as shown in FIGS. 2-4, cell A-I may include density ratios $DR_1\%$ equal to density ratios $DR_n\%$ or other cells of the plurality of cells 106 positioned the predetermined number (e.g., three) of cells away. That is, density ratios $DR_1\%$ of cell A-I may be equal to density ratios $DR_1\%$ of cell A-IV, and also density ratios $DR_1\%$ of cell D-IV.

Although cell group 110 is shown and discussed herein as a three (3) by three (3) group of cells 106, it is understood that cell group 110 may include any dimension of cells. That is, cell group 110 may include a plurality of distinct groups of cells of the plurality of cells 106 of test pattern layout 105 in pattern layer 104 to from cell group 110. Additionally, it is understood that, the predetermined number of cells separating distinct cells of the plurality of cells 106 including equal density ratios $DR_n\%$, may be directly dependent upon the cell dimensions of cell group 110. As such, as the cell dimension of cell group 110 increases/decreases, the predetermined number of cells separating distinct cells having equal density ratios $DR_n\%$ increases/decreases accordingly.

As a result of each adjacent cell of the plurality of cells 106 having distinct density ratios $DR_n\%$, and distinct cells separated by a predetermined number of cells including equal density ratios $DR_n\%$, a relationship of density ratios $DR_n\%$ for the plurality of cells 106 may be established in varied density pattern 108. That relationship of density ratios $DR_n\%$ may now be described. As shown in FIG. 2, the plurality of cells 106 having varied density pattern 108 may include a first group of cells A-I, B-I, C-I arranged along a first line $L_1$ having a first combined density ratio (e.g., $DR_1\%+DR_2\%+DR_3\%$). Additionally, as shown in FIG. 2, the plurality of cells 106 may include a second group of cells A-I, A-II, A-III arranged along a second line $L_2$ having a second combined density ratio (e.g., $DR_1\%+DR_4\%+DR_7\%$). The relationship between first group of cells A-I, B-I, C-I and second group of cells A-I, A-II, A-III may be that first combined density ratio (e.g., $DR_1\%+DR_2\%+DR_3\%$) of first group of cells A-I, B-I, C-I is equal to second combined density ratio (e.g., $DR_1\%+DR_4\%+DR_7\%$) of second group of cells A-I, A-II, A-III. That is, the combined density ratio $\Sigma DR_n\%$ of the cells positioned along first line $L_1$ is equal to the combined density ratio $\Sigma DR_n\%$ of the cells positioned along second line $L_2$. As shown in FIG. 2, for the relationship between the groups of cells 106 to be present, the number of cells in first group of cells A-I, B-I, C-I may be equal to the number of cells in second group of cells A-I, A-II, A-III. That is, as shown in FIG. 2, the number of cells in first group of cells A-I, B-I, C-I may be three (3) and the number of cells in second group of cells A-I, A-II, A-III may also be three. Additionally, as shown in FIG. 2, first group of cells A-I, B-I, C-I arranged along first line $L_1$ may include at least one cell (e.g., A-I) included in second group of cells A-I, A-II, A-III arranged along second line $L_2$.

For example, with reference to FIG. 2, first group of cells A-I, B-I, C-I arranged along first line $L_1$ include density ratios $DR_1\%$, $DR_2\%$, $DR_3\%$, respectively. In the example, density ratios $DR_1\%$ for cell A-I may be 80%, density ratios $DR_2\%$ for cell B-I may be 10%, and density ratios $DR_3\%$ for cell C-I may be 60%. As a result, the combined density ratio for first group of cells A-I, B-I, C-I arranged along first line $L_1$ may be 150% (i.e., $DR_1\%+DR_2\%+DR_3\%=80\%+10\%+60\%=150\%$). As discussed herein, for the relationship between first group of cells A-I, B-I, C-I arranged along first line $L_1$ and second group of cells A-I, A-II, A-III arranged along second line $L_2$ to be present, the combined density ratio for second group of cells A-I, A-II, A-III must also be 150%. Additionally, as discussed herein, adjacent cells of the plurality of cells 106 may not include equal density ratios $DR_n\%$, and each cell included in cell group 110 may include distinct density ratios $DR_n\%$. As a result, and in accordance with the example, test pattern layout 105 in pattern layer 104 including the plurality of cells 106 may be manufactured such that, density ratios $DR_1\%$ for cell A-I may be 80%, density ratios $DR_4\%$ for cell A-II may be 30%, and density ratios $DR_7\%$ for cell A-III may be 40%. In the example, all cells included in first group of cells A-I, B-I, C-I, and second group of cells A-I, A-II, A-III include distinct density ratios $DR_n\%$. As a result, in the example, the combined density ratio for second group of cells A-I, A-II, A-III arranged along second line $L_2$ may be 150% (i.e., $DR_1\%+DR_4\%+DR_7\%=80\%+30\%+40\%=150\%$).

Continuing the example, and with reference to FIG. 2, a third group of cells A-I, B-II, C-III arranged along a third line $L_3$ may also include a combined density ratio (e.g., $DR_1\%+DR_5\%+DR_9\%$) equal to the combined density ratios of first group of cells A-I, B-I, C-I arranged along first line $L_1$ and/or second group of cells A-I, A-II, A-III arranged along second line $L_2$ (e.g., 150%). More specifically, density ratios $DR_1\%$ for cell A-I may be 80%, density ratios $DR_5\%$ for cell B-II may be 50%, and density ratios $DR_9\%$ for cell C-III may be 20%. Continuing the example, the combined density ratio for third group of cells A-I, B-II, C-III arranged along third line $L_3$ may be 150% (i.e., $DR_1\%+DR_5\%+DR_9\%=80\%+50\%+20\%=150\%$).

Turning to FIG. 3, an additional embodiment of pattern layer 106 of test photomask 100 (FIG. 1) is shown according to embodiments of the invention. As shown in FIG. 3, first group of cells A-I, B-I, C-I arranged along first line $L_1$ may include zero cells included in a distinct group of cells arranged along a distinct line. That is, as shown in FIG. 3, first group of cells A-I, B-I, C-I may not include any similar cells included in a distinct group of cells, as discussed herein. First group of cells A-I, B-I, C-I arranged along first line $L_1$ may be substantially similar to first group of cells A-I, B-I, C-I arranged along first line $L_1$ in FIG. 2. FIG. 3 also shows a distinct group of cells or a fourth group of cells A-II, B-II, C-II arranged along a fourth line $L_4$ having a combined density ratio (e.g., $DR_4\%+DR_5\%+DR_6\%$). As discussed above, fourth group of cells A-II, B-II, C-II arranged along a fourth line $L_4$ may include the same number of cells as first group of cells A-I, B-I, C-I arranged along first line $L_1$, wherein each cell included in both fourth group of cells A-II, B-II, C-II and first group of cells A-I, B-I, C-I include distinct density ratios $DR_n\%$. Continuing the example from FIG. 2, in order for the relationship of density ratios $DR_n\%$ for the plurality of cells 106 to be present, combined density ratio (e.g., $DR_4\%+DR_5\%+DR_6\%$) of fourth group of cells A-II, B-II, C-II arranged along a fourth line $L_4$ may equal combined density ratio (e.g., $DR_1\%+DR_2\%+DR_3\%$) of first group of cells A-I, B-I, C-I (e.g., 150%). As a result, and in accordance with the example, test pattern layout 105 including the plurality of cells 106 may be manufactured such that, density ratios $DR_4\%$ for cell A-II may be 30%, density ratios $DR_5\%$ for cell B-II may be 50%, and density ratios $DR_6\%$ for cell C-II may be 70%. In the example, the combined density ratio for fourth group of cells A-II, B-II, C-II arranged along fourth line $L_4$ may be 150% (i.e., $DR_4\% + DR_5\% + DR_6\% = 30\% + 50\% + 70\% = 150\%$).

Additionally, as shown in FIG. 3, a similar relationship between a fifth group of cells A-III, B-III, C-III arranged along a fifth line $L_5$ may be present. That is, as shown in FIG. 3, a combined density ratio (e.g., $DR_7\% + DR_8\% + DR_9\%$) for fifth group of cells A-III, B-III, C-III arranged along a fifth line $L_5$ may be equal to the combined density ratios of first group of cells A-I, B-I, C-I arranged along first line $L_1$ and/or fourth group of cells A-II, B-II, C-II arranged along fourth line $L_4$ (e.g., 150%). More specifically, density ratios $DR_7\%$ for cell A-III may be 40%, density ratios $DR_8\%$ for cell B-III may be 90%, and density ratios $DR_9\%$ for cell C-III may be 20%. Continuing the example, the combined density ratio for fifth group of cells A-III, B-III, C-III arranged along fifth line $L_5$ may also be 150% (i.e., $DR_7\% + DR_8\% + DR_9\% = 40\% + 90\% + 20\% = 150\%$).

Turning to FIG. 4, a further embodiment of pattern layer 106 of test photomask 100 (FIG. 1) is shown according to embodiments of the invention. As shown in FIG. 4, first group of cells A-I, B-I, C-I arranged along first line $L_1$ may include a plurality of cells included in a distinct group of cells arrange along a distinct line. More specifically, as shown in FIG. 4, first group of cells A-I, B-I, C-I arranged along first line $L_1$ may include a plurality of cells also included in a sixth group of cells B-I, C-I, D-I arranged along a sixth line $L_6$. As shown in FIG. 4, sixth group of cells B-I, C-I, D-I arranged along a sixth line $L_6$ also has a combined density ratio (e.g., $DR_2\% + DR_3\% + DR_1\%$). Sixth group of cells B-I, C-I, D-I arranged along sixth line $L_6$ may include the same number of cells as first group of cells A-I, B-I, C-I arranged along first line $L_1$. Also, as shown in FIG. 4, sixth group of cells B-I, C-I, D-I may share two common cells (e.g., B-I, C-I) with first group of cells A-I, B-I, C-I. As discussed above, cell group 110 may be repeated to form varied density pattern 108 of test pattern layout 105. That is, and as discussed above, the three (3) by three (3) group of cells of the plurality of cells 106 forming cell group 110 may be repeated to form the various (partially shown) cell groups 110a, 110b, 110c which may collectively form varied density pattern 108 of test pattern layout 105 in pattern layer 104.

Continuing the examples of FIGS. 2 and 3, the relationship of density ratios $DR_n\%$ for the plurality of cells 106 may be present where the identified group of cells (e.g., first group of cells A-I, B-I, C-I, sixth group of cells B-I, C-I, D-I) may not be contained in the same cell group 110. That is, as shown in FIG. 4, combined density ratio for first group of cells A-I, B-I, C-I arranged along first line $L_1$ may also be 150% (e.g., $DR_1\% + DR_2\% + DR_3\% = 80\% + 10\% + 60\% = 150\%$). In continuing the relationship, and based upon the repetitive varied density pattern 108 formed in pattern layer 104, combined density ratio for sixth group of cells B-I, C-I, D-I arranged along sixth line $L_6$ may be 150% (e.g., $DR_2\% + DR_3\% + DR_1\% = 10\% + 60\% + 80\% = 150\%$). That is, first group of cells A-I, B-I, C-I and sixth group of cells B-I, C-I, D-I include a plurality of common cells (e.g., B-I, C-I). Additionally, and as discussed above, cell D-I is positioned a predetermined number (e.g., three (3)) cells away from cell A-I. As a result, cells A-I and D-I include equal density ratios $DR_1\%$. As such, the relationship between two distinct groups of cells of the plurality of cells 106 may be present where at least one cell a group of cells (e.g., sixth group of cells B-I, C-I, D-I) is not included in the same cell group 110 as a distinct group of cells (e.g., first group of cells A-I, B-I, C-I).

Various additional embodiments of the invention can include a method for evaluating critical dimensions (CD) in a test photomask 100. One method of evaluating critical dimension in test photomask 100 may now be described. Turning to FIGS. 5-8, one illustrative method according to various embodiments is shown. In particular, the method may include fabricating a test photomask 100 (FIG. 8) using an electron beam 150 (FIG. 5) to write test pattern layout 105 (FIG. 5) configured to substantially neutralize a fogging effect. As described herein, test pattern layout 105 includes a plurality of cells 106 (FIGS. 2-4) having varied density pattern 108 (FIG. 1). Plurality of cells 106 may include a first group of cells arranged along a first line, the first group of cells having a first combined density ratio; and a second group of cells arranged along a second line, the second group of cells having a second combined density ratio, wherein the second combined density ratio for the second group of cells is equal to the first combined density ratio of the first group of cells.

Figure 5:
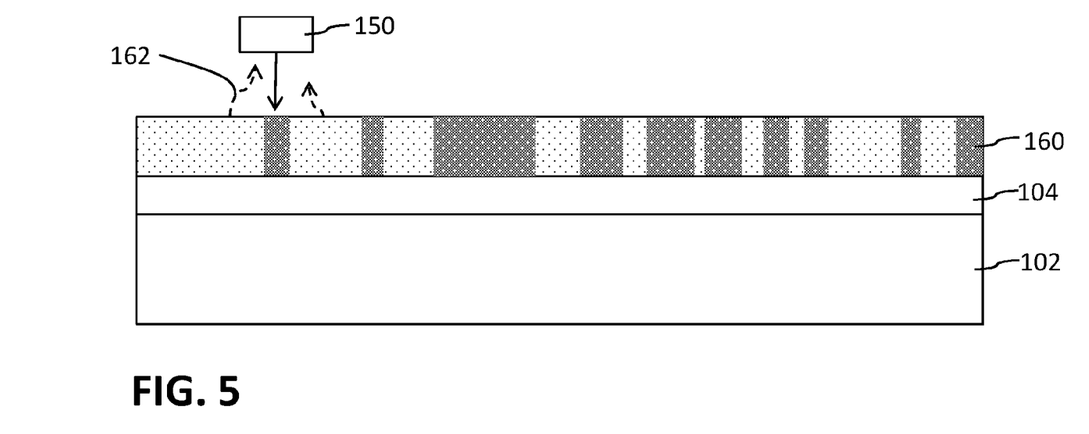
FIGS. 5-8 show a method of evaluating and fabrication a test photomask according to embodiments of the invention.
Figure 6:
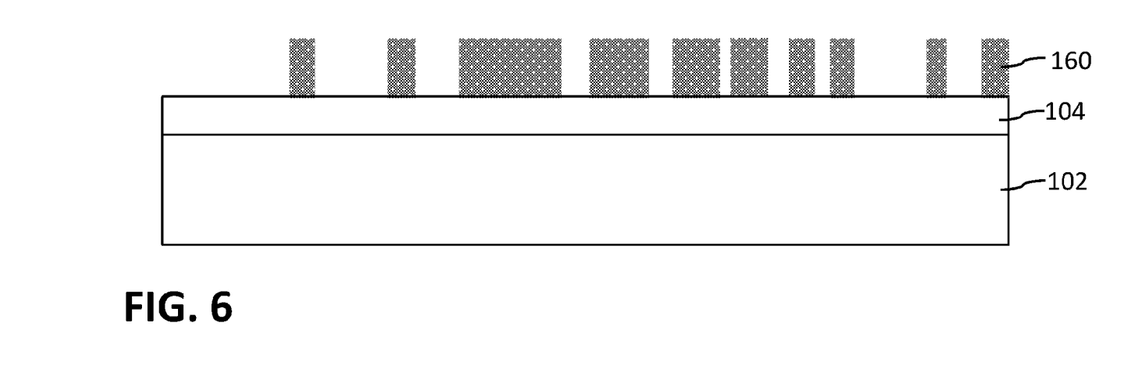
Figure 7:
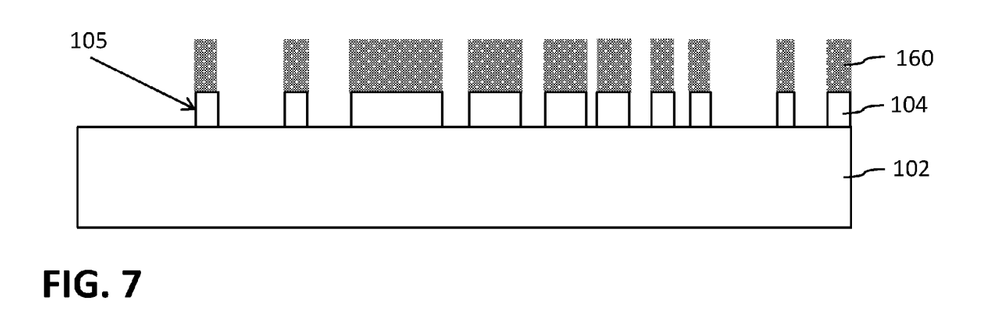
Figure 8:
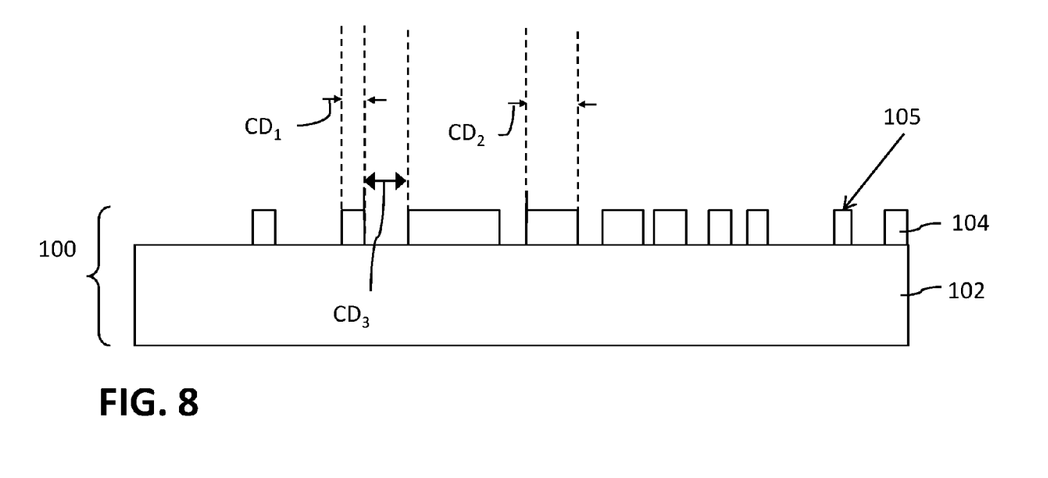

The fabrication may use any now known or later developed techniques. For example, as shown in FIG. 5, a transparent substrate layer 102 has a pattern layer 104 thereon. Substrate layer 102 of test photomask 100 may include any material having desirable properties, including, but not limited to: glass, quartz, or silicon dioxide. That is, substrate layer 102 may include any substantially rigid material that supports the pattern and has appropriate optical properties for the application. Pattern layer 104 may include any appropriate photomask material, such as chrome. An appropriate photoresist layer 160 is formed over pattern layer 104. As illustrated, an electron beam 150 writes test pattern layout 105 into photoresist layer 160, indicated by the different shaded parts of photoresist layer 160. That is, test pattern layout 105 is exposed to electron beam 150. As discussed herein, backscatter electrons cause fogging. As the electrons are reflected back from the test photomask, they are also reflected back to towards the test photomask, but the area covered is enlarged. The goal of the test pattern layout is to make the fogging uniform so the critical dimension uniformity issue from other effects can be seen. The variation of the test pattern layout density being less than the overall fogging radius allows this neutralization of the fogging effect to occur. That is, test pattern layout varies density fast enough that the extent of the fogging is larger than the density variation, while simultaneously maintaining the density in the extent of fogging the same. By then looking at the critical dimension change as a function of density, one can see a relationship between density and critical dimension change for other effects. In FIG. 6, photoresist layer 160 is developed, and in FIG. 7, photoresist layer 160 is etched to form test pattern layout 105 in pattern layer 104. FIG. 8 shows test photomask 100 including test pattern layout 105, i.e., in pattern layer 104, including a plurality of cells 106 having a varied density pattern 108. That is, test pattern layout 105 may include the plurality of cells 106 which form varied density pattern 108 throughout the entire pattern layer 104, such that test photomask 100 does not include a uniform density throughout pattern layer 104.

FIG. 8 also shows a step of evaluating a critical dimension (CD) of test pattern layout 105 on test photomask 100 to identify an error attributed to an effect other than the fogging effect. As described herein, the evaluating may include exposing test pattern layout 106 within the plurality of cells to electron beam 160 such that the test pattern layout substantially neutralizes the fogging effect within the test photomask during the exposing. As indicated above, errors attributable to fogging effects are substantially neutralized by test pattern layout 105. Consequently, an effect other than the fogging effect can be readily identified, e.g., a develop loading effect, using conventional techniques. As indicated, the critical dimension(s) (CD) evaluated to identify an error can take any form, e.g., a structure width such as $CD_1$ or $CD_2$, spacing between structures such as $CD_3$. The evaluation may be carried out using any now known or later developed technique for measuring critical dimensions such as conventional measurements using a scanning electron microscope. In this fashion, the evaluating of the CD of test pattern layout 105 may include determining non-uniformity in the CD, e.g., across pattern layer 104. The evaluation may include determining whether the effect other than the fogging effect is within of an acceptable range for the effect other than the fogging effect. For example, whether a develop loading effect error is within an acceptable range. Furthermore, in response to the effect not being within the acceptable range, modifying a mask patterning condition, e.g., operating parameter of electron beam 150, etc., during fabricating of a non-test pattern photomask to correct for the error.

Additionally, it is understood that the above outlines a general method for designing a test photomask so that the configuration of pattern densities enables the substantial neutralization of one length scale so that a different effect possessing a different length scale can be isolated and quantified. More specifically, by substantially neutralizing the fogging effects of an electron beam patterning process, other effects such as the develop loading effect on test photomask pattern 100, can be quantified.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A test pattern layout for a test photomask, the test pattern layout comprising:
   a plurality of cells having a varied density pattern, the plurality of cells including:
   a first group of cells arranged along a first line, the first group of cells having a first combined density ratio, and each cell of the first group of cells having a respective density ratio; and
   a second group of cells arranged along a second line, the second group of cells having a second combined density ratio, each cell in the second group of cells having a respective density ratio and wherein at least one of the respective density ratios of the cells in the second group is distinct from each of the respective density ratios of the cells in the first group,
   wherein each cell of the second group of cells has a same shape as each cell of the first group of cells, and
   wherein the second combined density ratio for the second group of cells is equal to the first combined density ratio of the first group of cells.

2. The test pattern layout of claim 1, wherein a predetermined number of cells in the first group of cells is equal to a predetermined number of cells in the second group of cells.

3. The test pattern layout of claim 2, wherein the predetermined number of cells in the first group of cells is three, and
   wherein the predetermined number of cells in the second group of cells is three.

4. The test pattern layout of claim 1, wherein the first group of cells arranged along the first line include at least one cell included in the second group of cells arranged along the second line.

5. The test pattern layout of claim 1, wherein the first group of cells arranged along the first line include zero cells included in the second group of cells arranged along the second line.

6. The test pattern layout of claim 1, wherein the density ratio for each of the plurality of cells having the varied density pattern includes a degree of transparency of each cell.

7. The test pattern layout of claim 1, wherein the density ratio of a first cell is distinct from the density ratio of each adjacent cell to the first cell in the plurality of cells having the varied density pattern.

8. The test pattern layout of claim 7, wherein the density ratio of the first cell is equal to the density ratio of a distinct cell positioned a predetermined number of cells away from the first cell.

9. The test pattern layout of claim 1, wherein the plurality of cells having the varied density pattern are configured substantially neutralize fogging effects during the mask patterning process.

10. A test photomask comprising:
    a varied density pattern configured spatially to substantially neutralize fogging effects within a photomask, the varied density pattern including:
    a first group of cells arranged along a first line, the first group of cells having a first combined density ratio, and each cell in the first group of cells having a pattern therein and a respective density ratio based on the pattern, wherein the respective density ratios are distinct from one another; and
    a second group of cells arranged along a second line, the second group of cells having a second combined density ratio, and each cell in the second group of cells having a pattern therein and a respective density ratio based on the pattern, wherein the respective density ratios are distinct from one another,
    wherein at least one of the respective density ratios of the cells in the second group is distinct from each of the respective density ratios of the cells in the first group, and
    wherein the second combined density ratio for the second group of cells is equal to the first combined ratio of the first group of cells.

11. The test photomask of claim 10, wherein a density ratio of a first cell is distinct from a density ratio of each adjacent cell to the first cell in the plurality of cells having the varied density pattern.

12. The test photomask of claim 11, wherein the density ratio of the first cell is equal to a density ratio of a distinct cell positioned a predetermined number of cells away from the first cell.

13. The test photomask of claim 10, wherein a predetermined number of cells in the first group of cells is equal to a predetermined number of cells in the second group of cells.

14. The test photomask of claim 10, wherein the first group of cells arranged along the first line include at least one cell included in the second group of cells arranged along the second line.

15. A test pattern layout for a test photomask, the test pattern layout comprising:
 a plurality of cells having a varied density pattern configured spatially to substantially neutralize a fogging effect, the plurality of cells including:
  a first group of cells arranged along a first line, the first group of cells having a first combined density ratio, and each cell of the first group of cells having a respective density ratio distinct from each other; and
  a second group of cells arranged along a second line, the second group of cells having a second combined density ratio, each cell in the second group of cells having a respective density ratio distinct from each other,
 wherein each cell of the second group of cells has a same shape as each cell of the first group of cells, and
 wherein the second combined density ratio for the second group of cells is equal to the first combined density ratio of the first group of cells.

16. The test pattern layout of claim 1, wherein the second combined density ratio for the second group of cells being equal to the first combined density ratio of the first group of cells substantially neutralizes a fogging effect.

17. The test pattern layout of claim 1, wherein the at least one of the respective density ratios of the cells in the second group being distinct from each of the respective density ratios of the cells in the first group substantially neutralizes a fogging effect.

* * * * *